(12) United States Patent
Baek

(10) Patent No.: US 7,649,248 B2
(45) Date of Patent: Jan. 19, 2010

(54) STACK PACKAGE IMPLEMENTING CONDUCTIVE SUPPORT

(75) Inventor: Hyung-Gil Baek, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 180 days.

(21) Appl. No.: 11/328,289

(22) Filed: Jan. 10, 2006

(65) Prior Publication Data

US 2007/0029660 A1    Feb. 8, 2007

(30) Foreign Application Priority Data

Aug. 8, 2005    (KR) ............... 10-2005-0072484

(51) Int. Cl.
*H01L 23/02* (2006.01)
(52) U.S. Cl. ............... 257/686; 257/777; 438/109
(58) Field of Classification Search ............. 257/698, 257/686–687, 700, 782, 787, E25.031–E25.032, 257/E23.042; 438/109
See application file for complete search history.

(56) References Cited

U.S. PATENT DOCUMENTS 6,013,948 A * 1/2000 Akram et al. ............... 257/698
7,291,925 B2 * 11/2007 Han et al. ............... 257/777
2005/0184377 A1 * 8/2005 Takeuchi et al. ............ 257/686
2005/0242422 A1 * 11/2005 Klein et al. ................ 257/686

FOREIGN PATENT DOCUMENTS

| JP | 2002-170906 | 6/2002 |
|----|-------------|--------|
| KR | 1020040045696 A | 6/2004 |
| KR | 1020050027384 A | 3/2005 |

* cited by examiner

*Primary Examiner*—Theresa T Doan
(74) *Attorney, Agent, or Firm*—Harness, Dickey & Pierce, P.L.C.

(57) ABSTRACT

A stack package may have a plurality of unit packages. Each unit package may include a first substrate, a semiconductor chip, and a second substrate. Conductive supports may stack the second substrate on the first substrate. Conductive bumps may be provided on the bottom surface of the first substrate. An encapsulant may seal the semiconductor chip exposing the top surface of the second substrate. The conductive bumps of an upper unit package may be connected to the second substrate of the lower unit package.

20 Claims, 18 Drawing Sheets

STACK PACKAGE IMPLEMENTING CONDUCTIVE SUPPORT

PRIORITY STATEMENT

This U.S. non-provisional application claims benefit of priority under 35 U.S.C. §119 from Korean Patent Application No. 2005-72484, filed on Aug. 8, 2005, the entire contents of which are incorporated herein by reference.

BACKGROUND

1. Field of the Invention

Example embodiments of the present invention relate to a semiconductor device, and more particularly, to a stack package that may implement conductive supports.

2. Description of the Related Art

The electronic industry may seek methods, techniques and designs to produce electronic products that may be (for example)smaller, lighter, faster, more efficient, operate at higher speeds, provide multiple functions and/or result in improved performance, at an effective cost. One method that has been implemented is a chip scale packaging technique. The chip scale packaging technique may provide chip scale packages or chip size packages (CSPs).

To increase the capacity of semiconductor chips and/or decrease package size, cells may be arranged more densely in a limited area of the semiconductor chip. One approach has been 3-D type semiconductor packaging technologies that may involve stacking semiconductor chips and/or semiconductor packages.

A 3-D stack chip packaging technique may involve stacking semiconductor chips. Such chip stacking may, however, negatively impact production rates. For example, a single faulty chip in a stack of semiconductor chips may cause the whole stack of semiconductor chips to be faulty and/or non-repairable. Typically, chips may not be validated until after they have been packaged.

Another 3-D stack chip packaging technique may involve stacking packages instead of chips. Although a stack of packages may be thicker than a stack of chips (e.g., because each chip may include its own package), each package may be individually validated before stacking.

A conventional stack package 100 implementing a board on chip (BOC) package is described with reference to FIG. 1.

Referring to FIG. 1, the stack package 100 may have two unit packages 10 inclusive of an upper unit package 10a and a lower unit package 10b.

Each unit package 10 may include a substrate 20 having a top surface supporting a semiconductor chip 30, and a bottom surface supporting conductive bumps 60. The substrate 20 may have a window 25, and the semiconductor chip 30 may have pads 31 exposed through the window 25. Bonding wires 40 may connect the pads 31 to the substrate 20 through the window 25. An encapsulant 50 may seal the pads 31 and the bonding wires 40. The conductive bumps 60, which may serve as external connection terminals, may be arranged on the bottom surface of the substrate 20.

In the package structure, the semiconductor chip 30 may be exposed to the external environment. The conductive bumps 60 may have a greater height than the encapsulant 50 so that the unit package 10 may be attached to a motherboard and/or another unit package, for example.

The stack package 100 may be assembled by connecting the upper unit package 10b to the lower unit package 10a by the conductive bumps 60. For example, a flux may be applied to the conductive bumps 60 of the upper unit package 10b.

The conductive bumps 60 of the upper unit package 10b may be mounted on the lower unit package 10a and melted.

The encapsulant 50 of the upper unit package 10b may be close to the semiconductor chip 30 of the lower unit package 10a.

A substrate may be larger than a semiconductor chip. When the semiconductor package is mounted on external equipment, it may occupy a large mounting area.

Further, the semiconductor chip and the substrate may have different coefficients of thermal expansion. If thermal stresses are applied to a package, the package may warp, and conductive bump joint faults may be experienced.

The semiconductor chip 30 may be exposed to the external environment, and the semiconductor chip 30 may be susceptible to external factors.

An encapsulant may be provided on the top surface of the substrate. This may reduce a top surface area of the substrate that may be available for attachment of conductive bumps. Therefore, the encapsulant may be limited to an area of the top surface between a semiconductor chip mounting area and the conductive bump attaching area. Alternatively (or in addition), a larger substrate may be implemented.

On the one hand, the limited area of the encapsulant may be insufficient to resist the package warpage. On the other hand, the use of the larger substrate may increase the unit package area.

The bottom surface of the substrate corresponding to a chip mounting area may not be used as a conductive bump attaching area. If the number of conductive bumps increases, the use of a larger substrate having a larger conductive bump attaching area may be inevitable.

SUMMARY

According to an example, non-limiting embodiment of the present invention, a stack package may include a plurality of unit packages. Each of the unit packages may include a first substrate having a top surface and a bottom surface. A first chip may be mounted on the top surface of the first substrate. The first chip may have an active surface and a back surface. A plurality of conductive supports may be provided on the top surface of the first substrate and electrically connected to the first chip. A second substrate may be provided on and electrically connected to the conductive supports. The second substrate may have a top surface and a bottom surface. An encapsulant may seal the first chip and expose the top surface of the second substrate. A plurality of conductive bumps may be provided on the bottom surface of the first substrate. The conductive bumps of an upper unit package may be connected to the second substrate of a lower unit package.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

The drawings are provided for illustrative purposes only and are not drawn to scale. The spatial relationships and relative sizing of the elements illustrated in the various embodiments may have been reduced, expanded and/or rearranged to improve the clarity of the figure with respect to the corresponding description. The figures, therefore, should not be interpreted as accurately reflecting the relative sizing and/or positioning of the corresponding structural elements that could be encompassed by an actual device manufactured according to the example, non-limiting embodiments of the invention.

DETAILED DESCRIPTION OF EXAMPLE, NON-LIMITING EMBODIMENTS

Example, non-limiting embodiments of the present invention will be described more fully with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 1:
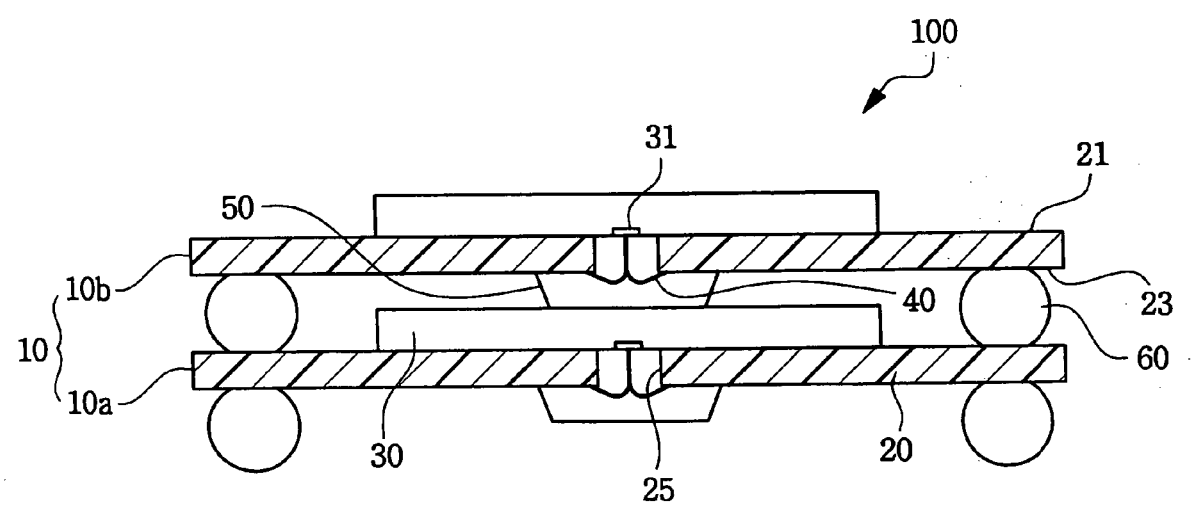
FIG. 1 is a cross-sectional view of a conventional stack package.
Figure 2:
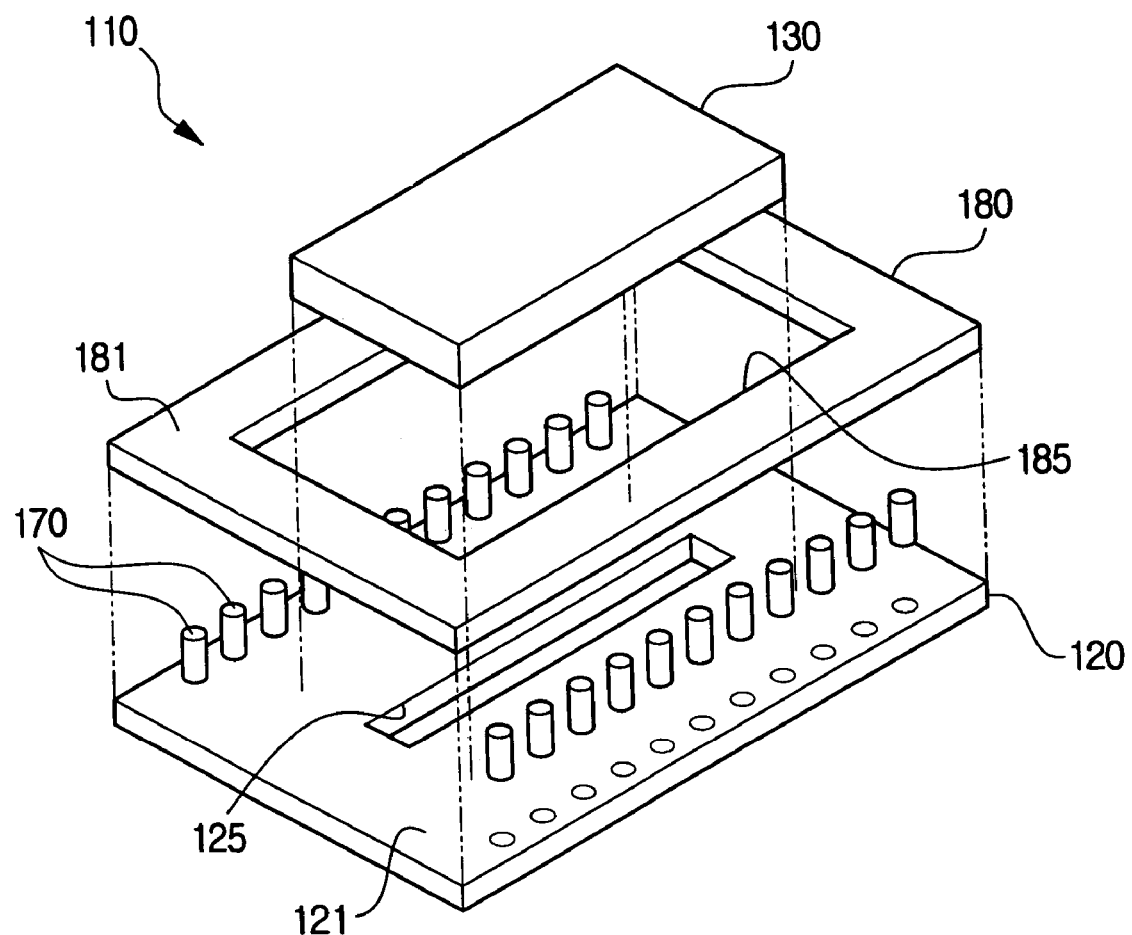
FIG. 2 is an exploded perspective view of a unit package in accordance with an example embodiment of the present invention.
Figure 3:
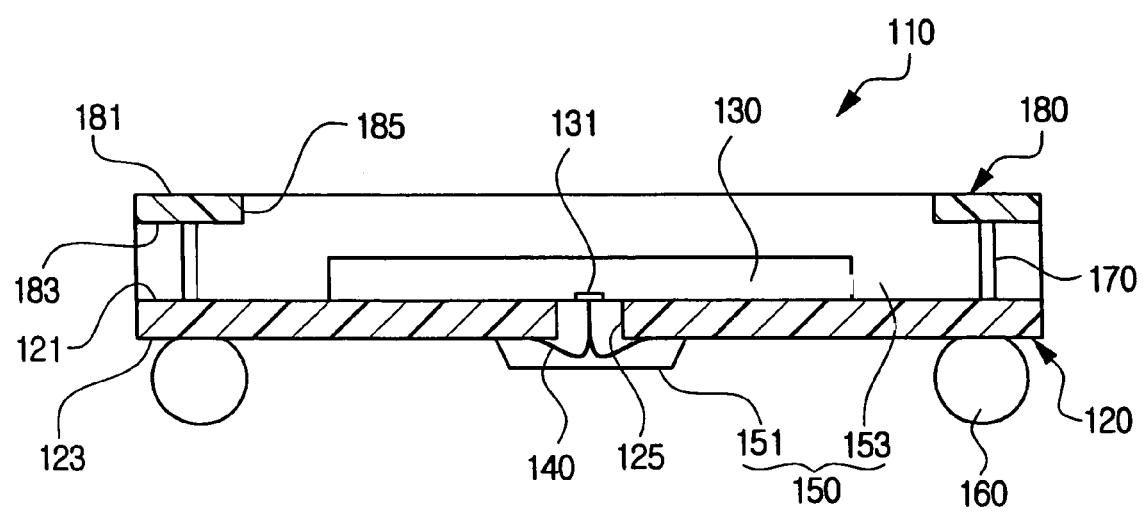
FIG. 3 is a cross-sectional view of the unit package illustrated in FIG. 2.
Figure 4:
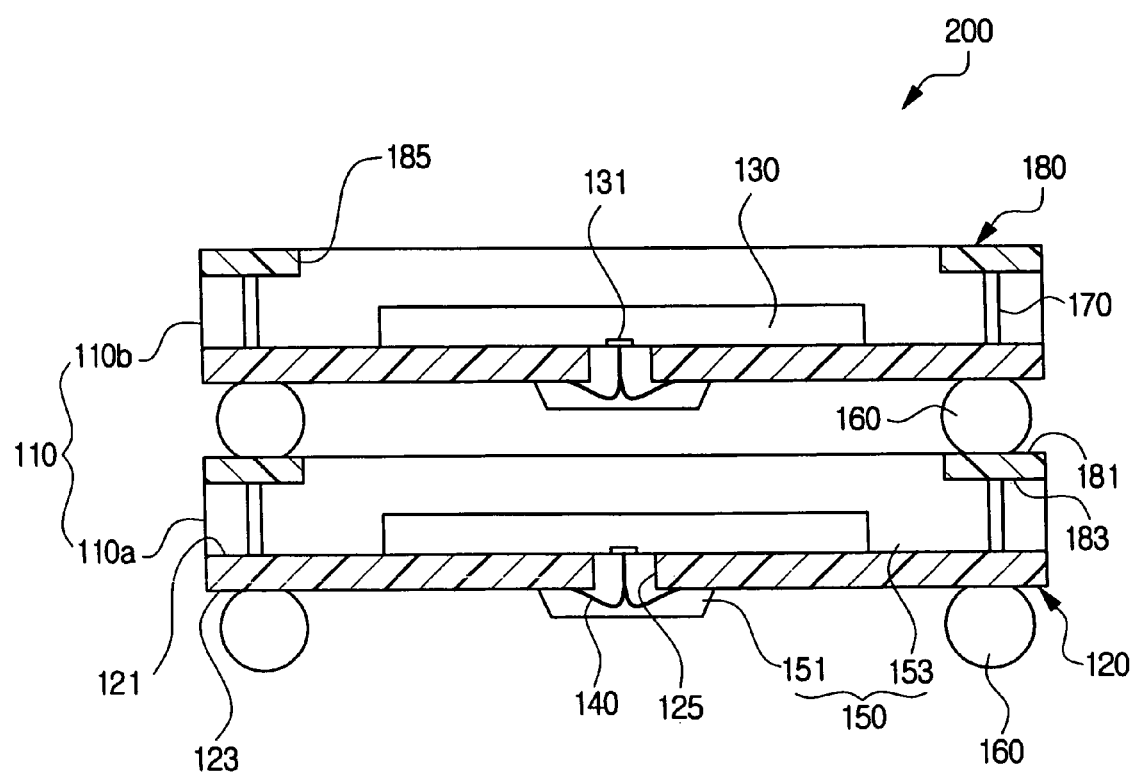
FIG. 4 is a cross-sectional view of an example stack package implementing the unit package of FIG. 2.

FIG. 2 is an exploded perspective view of a unit package 110 in accordance with an example embodiment of the present invention. FIG. 3 is a cross-sectional view of the unit package 110 illustrated in FIG. 2. FIG. 4 is a cross-sectional view of an example stack package 200 implementing the unit package 110 of FIG. 2.

Referring to FIGS. 2 through 4, the stack package 200 may include a plurality of unit packages 110. By way of example only, the unit package 110 may be a BOC type semiconductor package and include a lower unit package 110a and an upper unit package 110b. Each unit package 110 may include a first substrate 120, a semiconductor chip 130, and a second substrate 180.

The first substrate 120 may have a top surface 121 and a bottom surface 123. The semiconductor chip 130 may be mounted on the top surface 121 of the first substrate 120. A plurality of conductive supports 170 may be provided on the top surface 121 of the first substrate 120 along the sides of the semiconductor chip 130. The conductive supports 170 may be electrically connected to the semiconductor chip 130. The second substrate 180 may have a top surface 181 and a bottom surface 183, and may be provided on and electrically connected to the conductive supports 170. By way of example only, the conductive supports 170 may be conductive posts 170, each may have an elongate shape and stand upright on the first substrate 120. In alternative embodiments, the conductive supports 170 may have numerous and alternative geometric shapes. An encapsulant 150 may seal the semiconductor chip 130 and expose the top surface 181 of the second substrate 180.

A plurality of conductive bumps 160 may be provided on the bottom surface 123 of the first substrate 120. The conductive bumps 160 of the upper unit package 110b may be connected to the second substrate 180 of the lower unit package 110a. The conductive bumps 160 of the lower unit package 110a may serve as external connection terminals.

The structure of the unit package 110 is described below.

The semiconductor chip 130 may have an active surface supporting chip pads 131. By way of example only, the chip pads 131 may be arranged along a central portion of the active surface.

The first substrate 120 may have a first window 125. The chip pads 131 may be exposed through the first window 125. Respective wiring layers (not shown) may be provided on the top surface 121 and the bottom surface 123 of the first substrate 120. The semiconductor chip 130 may be mounted on the top surface 121 of the first substrate 120 so that the chip pads 131 may be exposed through the first window 125. The conductive posts 170 may be provided on the first substrate 120 outside of a chip mounting area.

The second substrate 180 may be stacked on the first substrate 120 using the conductive posts 170. The second substrate 180 may have a second window 185. The second window 185 may be larger than the semiconductor chip 130. The second substrate 180 may be stacked on the first substrate 120, and the semiconductor chip 130 may be passed through the second window 185 and attached to the first substrate 120. The top surface 181 of the second substrate 180 may be higher than the back (or top) surface of the semiconductor chip 130.

The conductive post 170 may include an inner body of a metal and/or a nonmetal, and a layer of Cu, Ni, and/or solder plated on the inner body. Alternatively, the conductive post 170 may include a Cu inner body and a layer of Ag, In, Ni and/or Au plated on the Cu inner body. In alternative embodiments, the conductive post 170 may be fabricated from numerous and alternative materials that are well known in this art. By way of example only, the conductive post 170 may be formed using a typical soldering process and/or by inducing an intermetallic bond using a metal diffusion through a thermocompression method.

Bonding wires 140 may electrically connect the chip pads 131 to the first substrate 120.

The encapsulant 150 may include a first encapsulant 151 sealing the chip pads 131 and the bonding wires 140, and a second encapsulant 153 sealing the semiconductor chip 130 and the conductive posts 170. The second encapsulant 153 may expose the top surface 181 of the second substrate 180.

The conductive bumps 160 may be arranged on the bottom surface 123 of the first substrate 120.

As described above, the second substrate 180 may be attached to the first substrate 120 using the conductive posts 170, and the top surface 181 of the second substrate 180 may be exposed. The second substrate 180 of the lower unit package 110a may provide an area for attaching the conductive bumps 160 of the upper unit package 110b. Therefore, example embodiments of the present invention may provide a conductive bump attaching area without increasing a package area and/or the semiconductor chip 130 may be sealed via an encapsulant 153.

This example embodiment may implement a BOC type semiconductor package. In alternative embodiments, the unit package 110 may implement a chip on board (COB) type package. For example, the back surface of the semiconductor chip may be attached to the top surface of the first substrate and the semiconductor chip may be electrically connected to the first substrate using bonding wires. Alternatively, the semiconductor chip may be flip chip bonded to the first substrate. In this case, the second substrate may be higher than the semiconductor chip.

This example embodiment may implement two unit packages 110. In alternative embodiments, more than two of the unit packages 110 may be suitably implemented.

Figure 5:
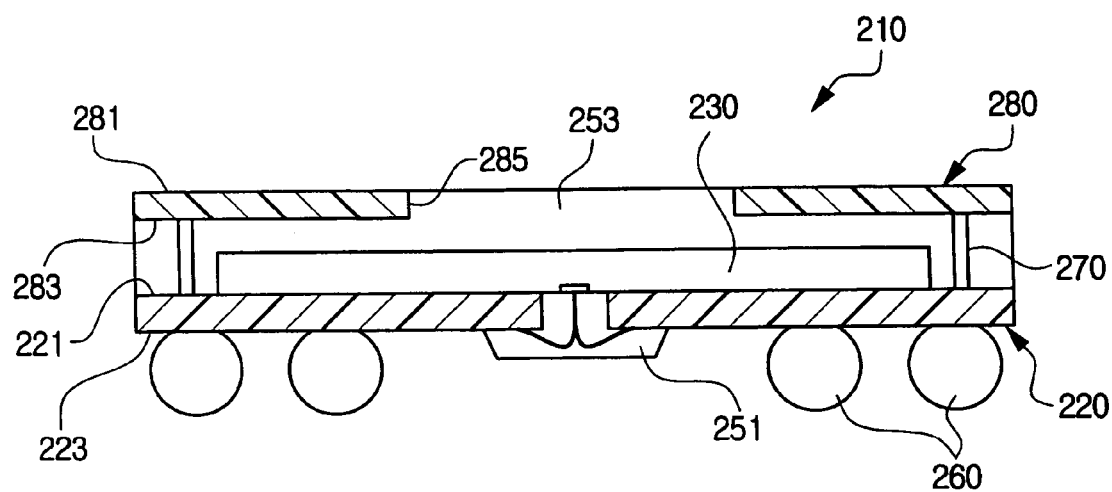
FIG. 5 is a cross-sectional view of a unit package in accordance with another example embodiment of the present invention.
Figure 6:
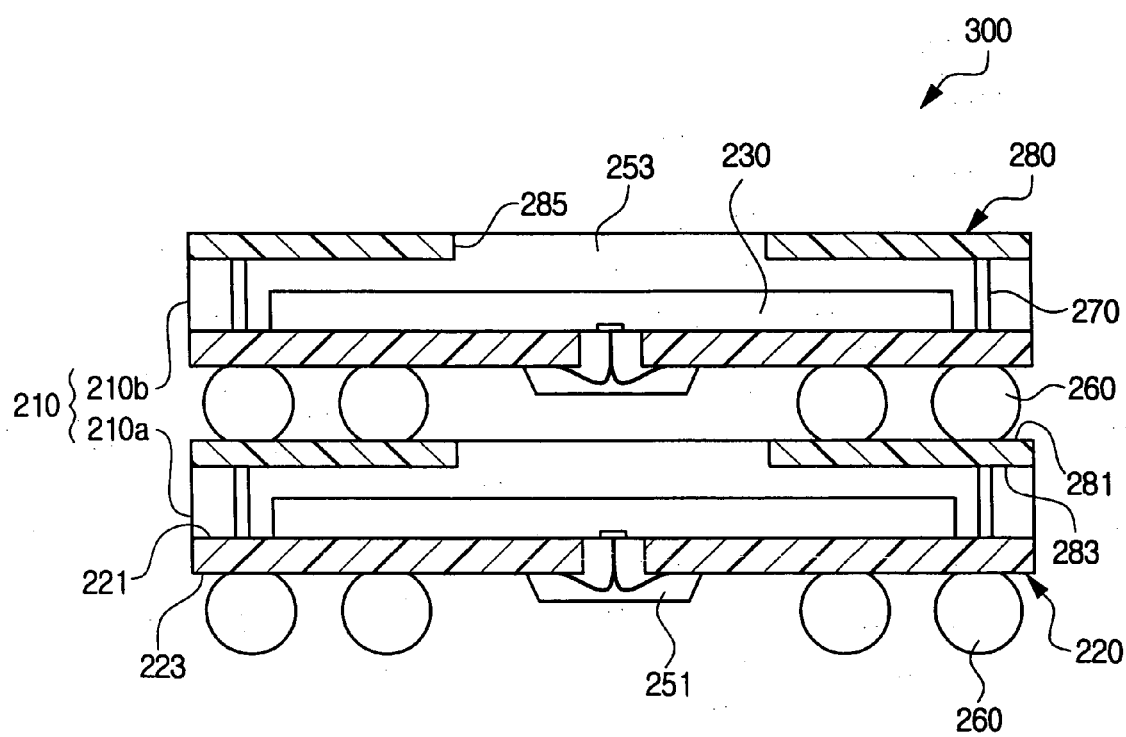
FIG. 6 is a cross-sectional view of an example stack package implementing the unit package of FIG. 5.

FIG. 5 is a cross-sectional view of a unit package 210 in accordance with another example embodiment of the present invention. FIG. 6 is a cross-sectional view of an example stack package 300 implementing the unit package 210 of FIG. 5.

Referring to FIGS. 5 and 6, the stack package 300 may have a plurality of unit packages 210, inclusive of (for example) a lower unit package 210a and an upper unit package 210b.

The unit packages 210 may have the same structure as that of the first example embodiment, except that a second substrate 280 may have a window 285 that is smaller than a semiconductor chip 230. The semiconductor chip 230 may extend to the conductive posts 270. The length of the conductive post 270 may be greater than the thickness of the semiconductor chip 230 to prevent mechanical interference between the semiconductor chip 230 and the second substrate 280.

The semiconductor chip 230 may be attached to a first substrate 220 and then the second substrate 280 may be stacked on the conductive posts 270. The upper end of the conductive post 270 may be connected to the bottom surface 283 of the second substrate 280. The lower end of the conductive post 270 may be connected to the top surface 221 of the first substrate 220. By way of example only, the connection of the lower end of the conductive post 270 to the top surface 221 of the first substrate 220 may be made using a thermocompression method during a molding process and/or separately from a molding process.

Conductive bumps 260 may be provided on the bottom surface 223 of the first substrate 220 corresponding to the semiconductor chip 230. The entire bottom surface 223 of the first substrate 220 outside a first encapsulant 251 may provide a conductive bump attaching area. Therefore, the stack package 300 of this example embodiment may reduce the mounting area of the unit package 210 and/or accommodate an increased quantity of conductive bumps 260.

Figure 7:
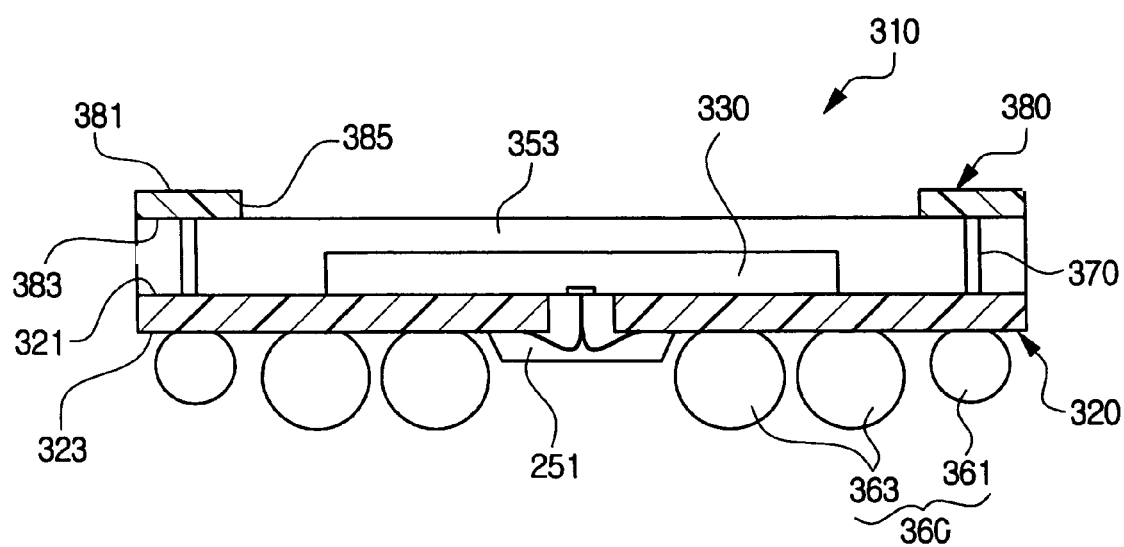
FIG. 7 is a cross-sectional view of a unit package in accordance with another example embodiment of the present invention.
Figure 8:
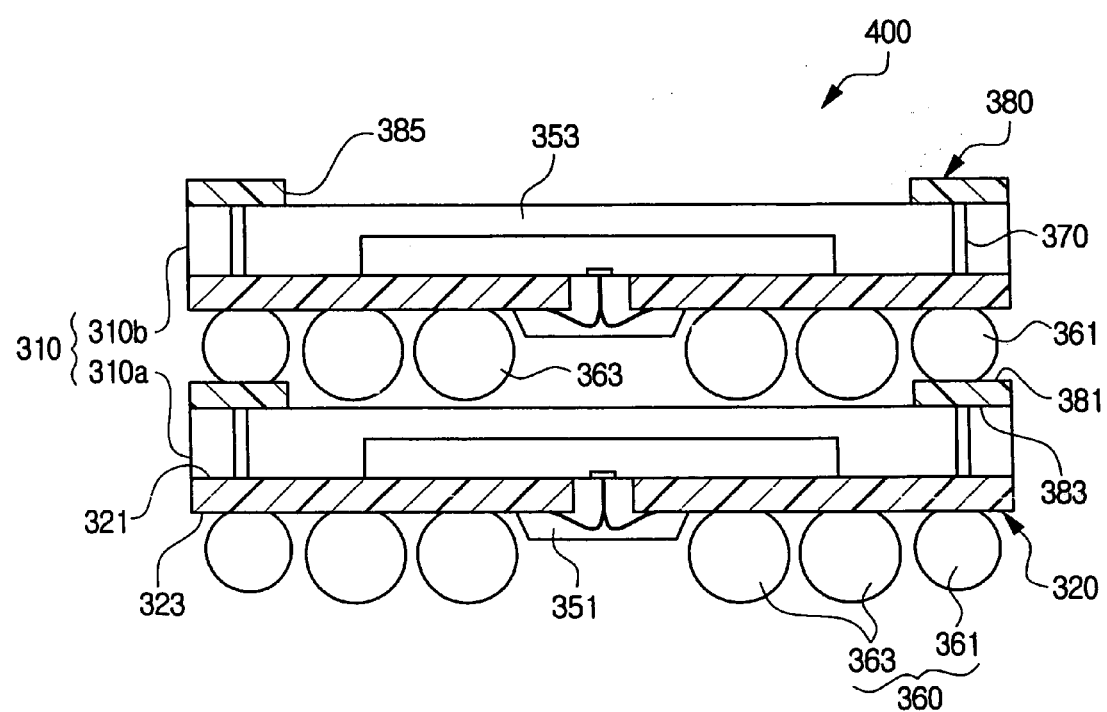
FIG. 8 is a cross-sectional view of an example stack package implementing the unit package of FIG. 7.

FIG. 7 is a cross-sectional view of a unit package 310 in accordance with another example embodiment of the present invention. FIG. 8 is a cross-sectional view of an example stack package 400 implementing the unit package 310 of FIG. 7.

Referring to FIGS. 7 and 8, the stack package 400 may have a plurality of unit packages 310 inclusive of a lower unit package 310a and an upper unit package 310b. By way of example only, the unit package 310 may have a standardized bump array.

The upper surface of a second encapsulant 353 may range between the top surface 381 and the bottom surface 383 of a second substrate 380. In this example embodiment, the upper surface of the second encapsulant 353 may be substantially level with the bottom surface 383 of the second substrate 380.

Conductive bumps 360 may be provided on the bottom surface 323 of a first substrate 320. The conductive bumps 360 may include first conductive bumps 361 corresponding to (e.g., provided below) the second substrate 380, and second conductive bumps 363 corresponding to (provided below) a window 385 of the second substrate 380. The first conductive bumps 361 may be arranged on the peripheral region of the bottom surface 323 of the first substrate 320, and the second conductive bumps 363 may be arranged between the first conductive bumps 361 and a first encapsulant 351. The first conductive bumps 361 may be implemented to stack the unit packages 310, and the second conductive bumps 363 may serve as external connection terminals.

In the stack package 400, the first conductive bumps 361 of the upper unit package 310b may be connected to the second substrate 380 of the lower unit package 310a, and the second conductive bumps 363 of the upper unit package 310b may be located in the window 385 of the second substrate 380 of the lower unit package 310a.

The second conductive bumps 363 may be larger than the first conductive bumps 361. The second conductive bumps 363 may be close to the second encapsulant 353, but they may not touch the second encapsulant 353. In other words, the second conductive bump 363 may be larger than the first conductive bumps 361 and smaller than the combined thicknesses of the second substrate 380 and the first conductive bump 361.

Figure 9A:
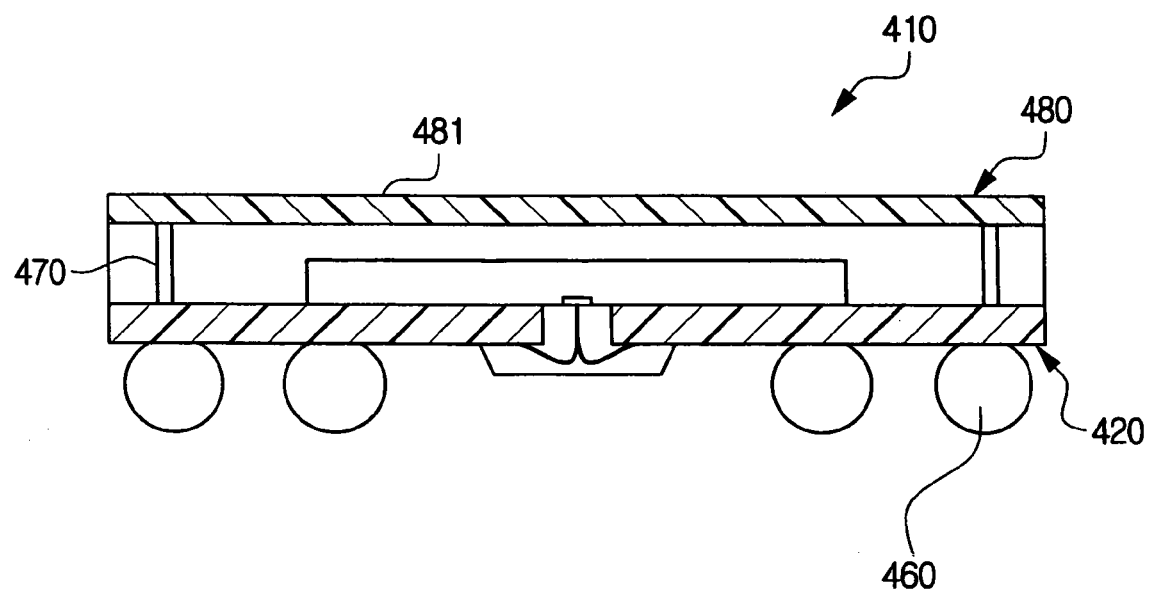
FIG. 9A is a cross-sectional view of a unit package in accordance with another example embodiment of the present invention.
Figure 9B:
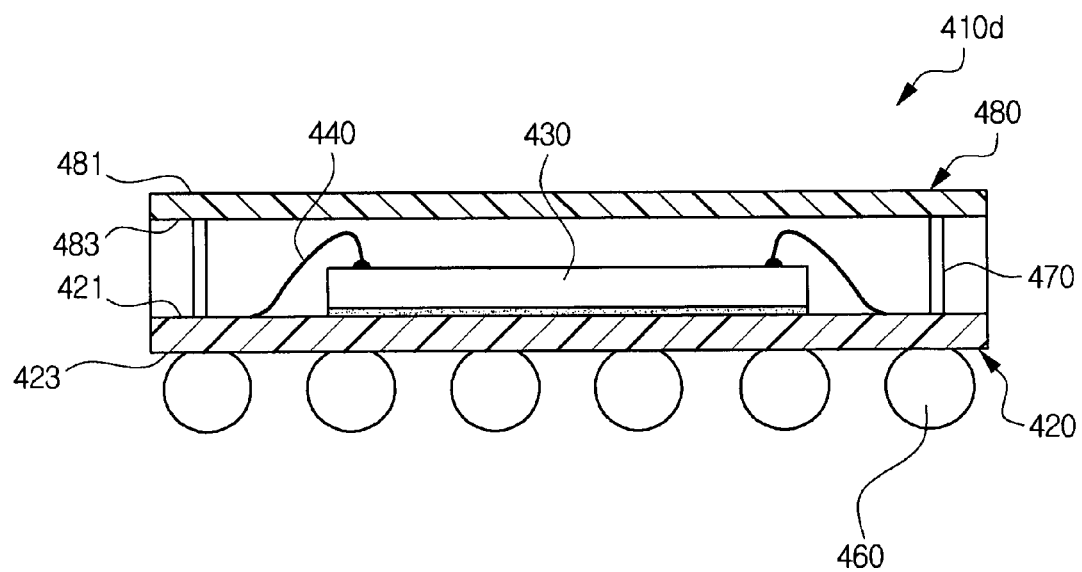
FIG. 9B is a cross-sectional view of a unit package in accordance with another example embodiment of the present invention.
Figure 10A:
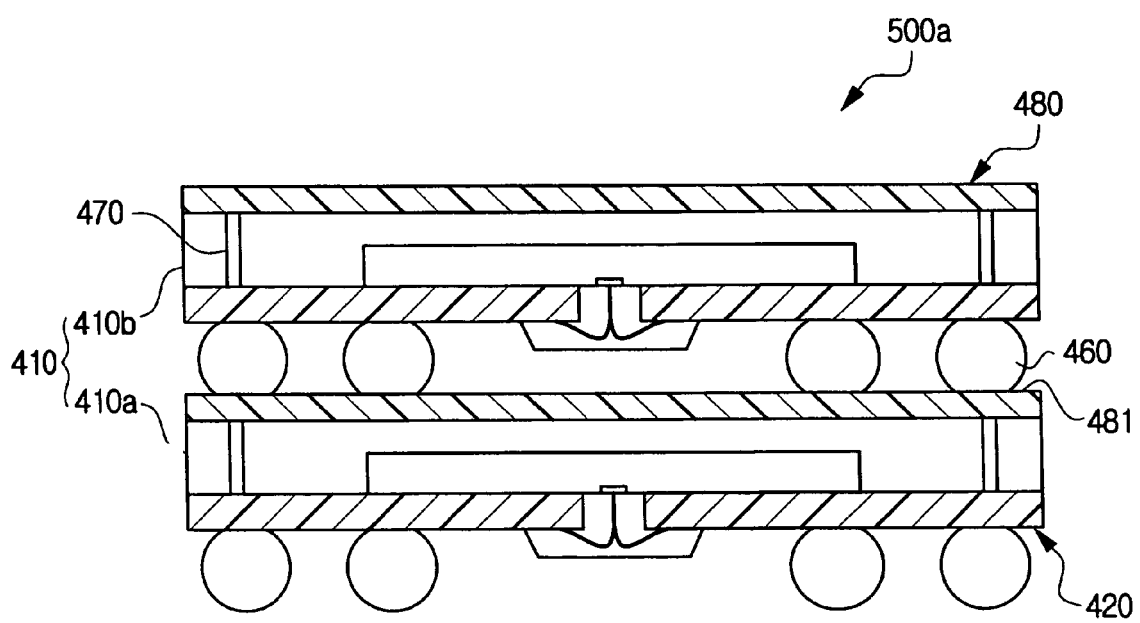
FIGS. 10A through 10C are cross-sectional views of example stack packages implementing the unit package of FIG. 9A.
Figure 10B:
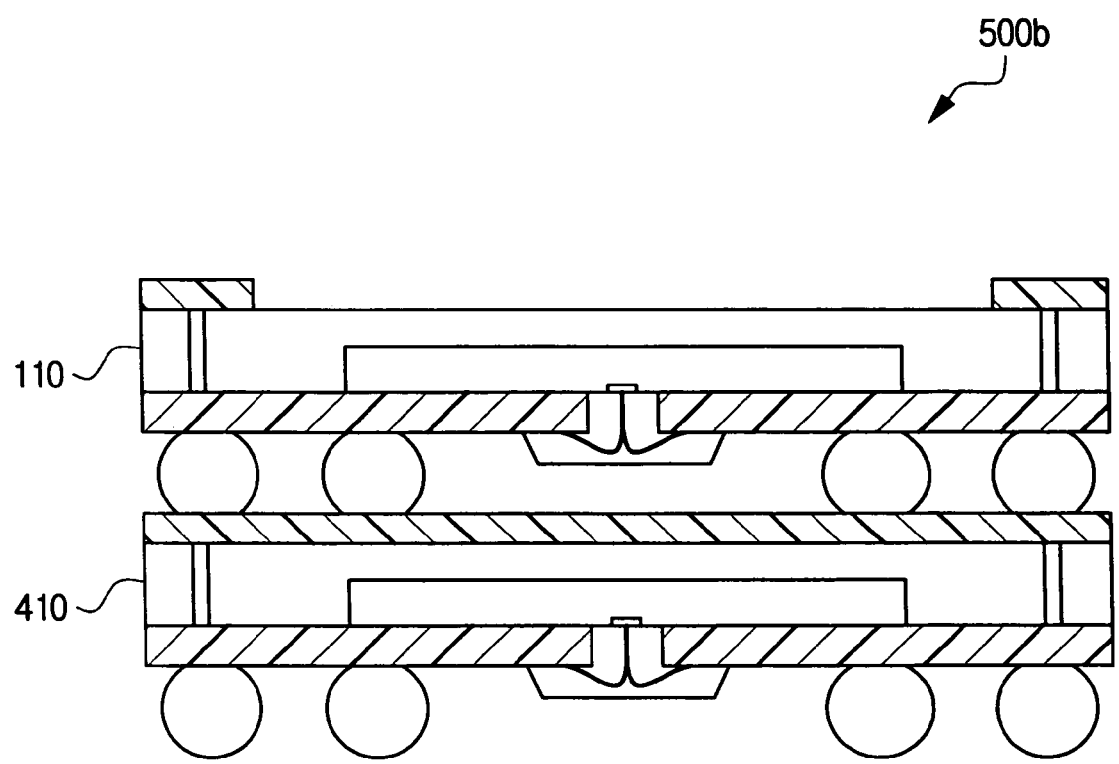
Figure 10C:
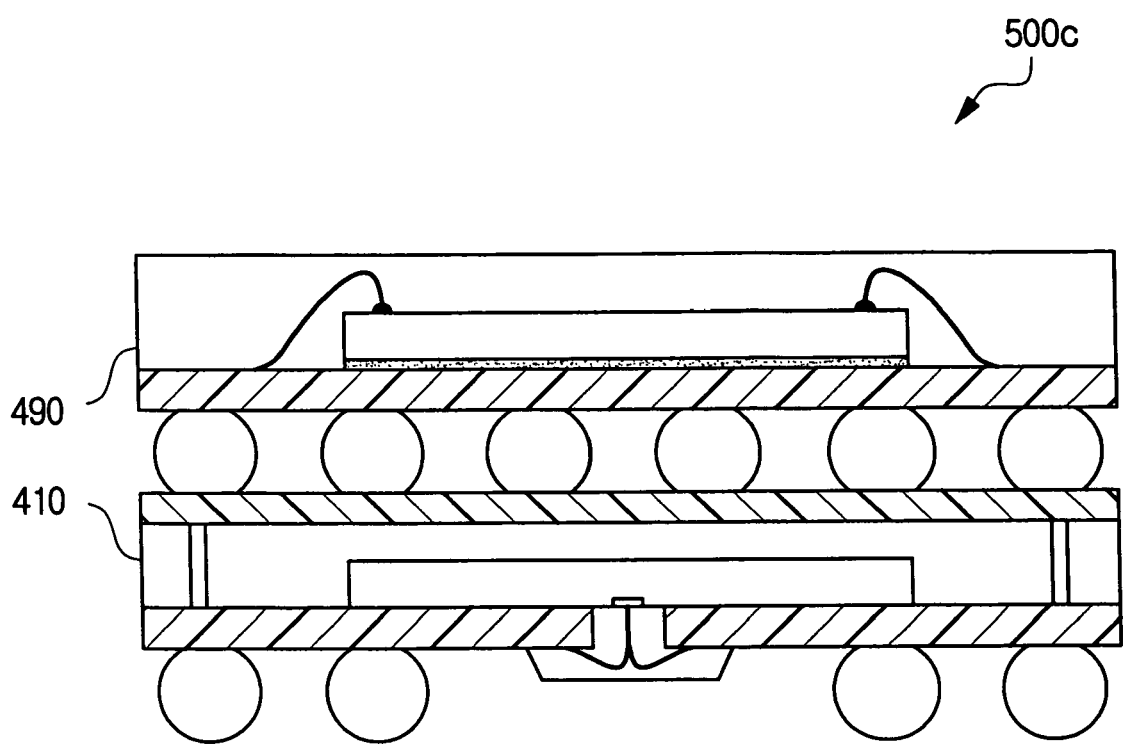
Figure 10D:
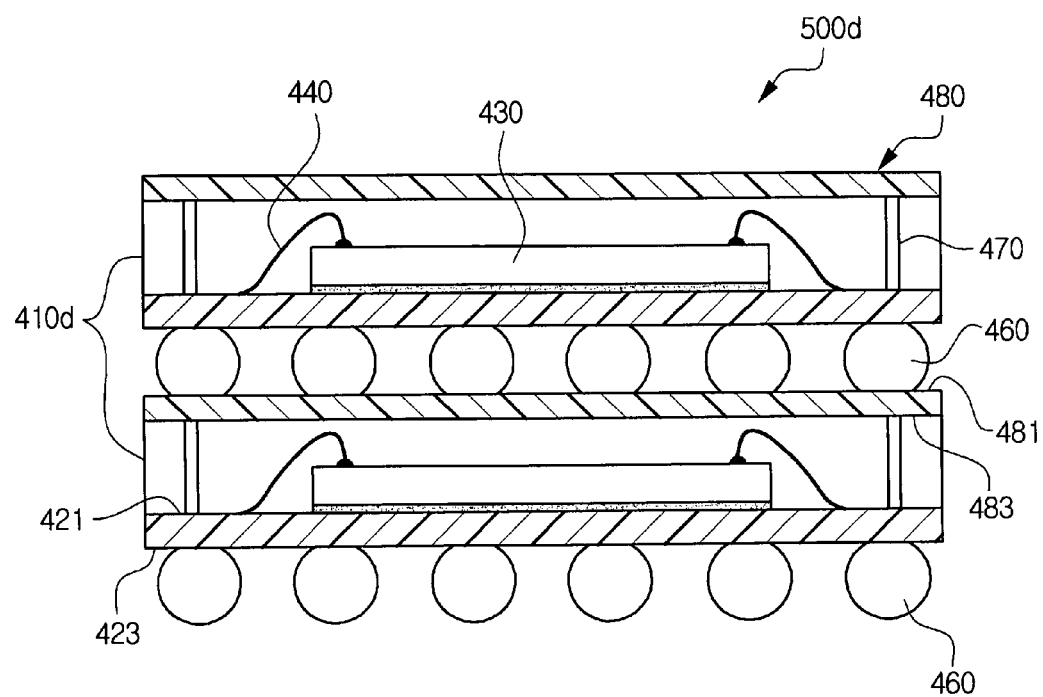
FIG. 10D is a cross-sectional view of an example stack package implementing the unit package of FIG. 9B.

FIG. 9A is a cross-sectional view of a unit package 410 in accordance with another example embodiment of the present invention. FIG. 9B is a cross-sectional view of a unit package 410' in accordance with another example embodiment of the present invention. FIGS. 10A through 10C are cross-sectional views of example stack packages implementing the unit package 410 of FIG. 9A. FIG. 10D is a cross-sectional view of a stack package 500d implementing the unit package 410' of FIG. 9B.

Referring to FIG. 9A, the unit package 410 may have a solid (or windowless) second substrate 480. The unit package 410 may be a BOC type semiconductor package, similar to the unit package of the first example embodiment.

The second substrate 480 may provide a mounting area for a ball grid array BGA semiconductor package including the unit package 410. For example, as shown in FIG. 10A, a plurality of the unit package 410 may be stacked to form a stack package 500a. As shown in FIG. 10B, the unit package 110 (described in detail above with reference to FIG. 3) may be stacked to form a stack package 500b. As shown in FIG. 10C, a BGA semiconductor package 490 may be stacked to form a stack package 500c. Alternatively, the unit package 210 (described in detail above with reference to FIG. 5) and/or the unit package 310 (described in detail above with reference to FIG. 7) may be stacked.

Referring to FIG. 9B, the unit package 410' may be a COB type semiconductor package. For example, a semiconductor chip 430 may be connected to a first substrate 421 using bonding wires 440. Here, the entire bottom surface 423 of the first substrate 420 may be available for supporting conductive bumps 460.

Referring to FIG. 10D, the stack package 500d may include a plurality of unit packages 410'. Various BGA semiconductor packages may be stacked on the unit package 410'.

Figure 11:
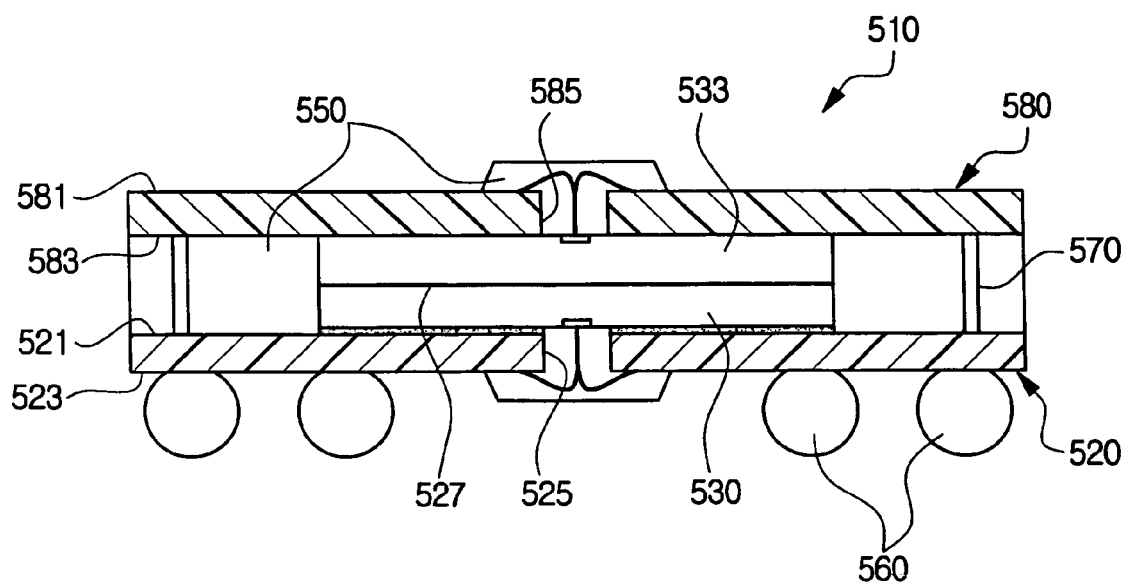
FIG. 11 is a cross-sectional view of a unit package in accordance with another example embodiment of the present invention.
Figure 12:
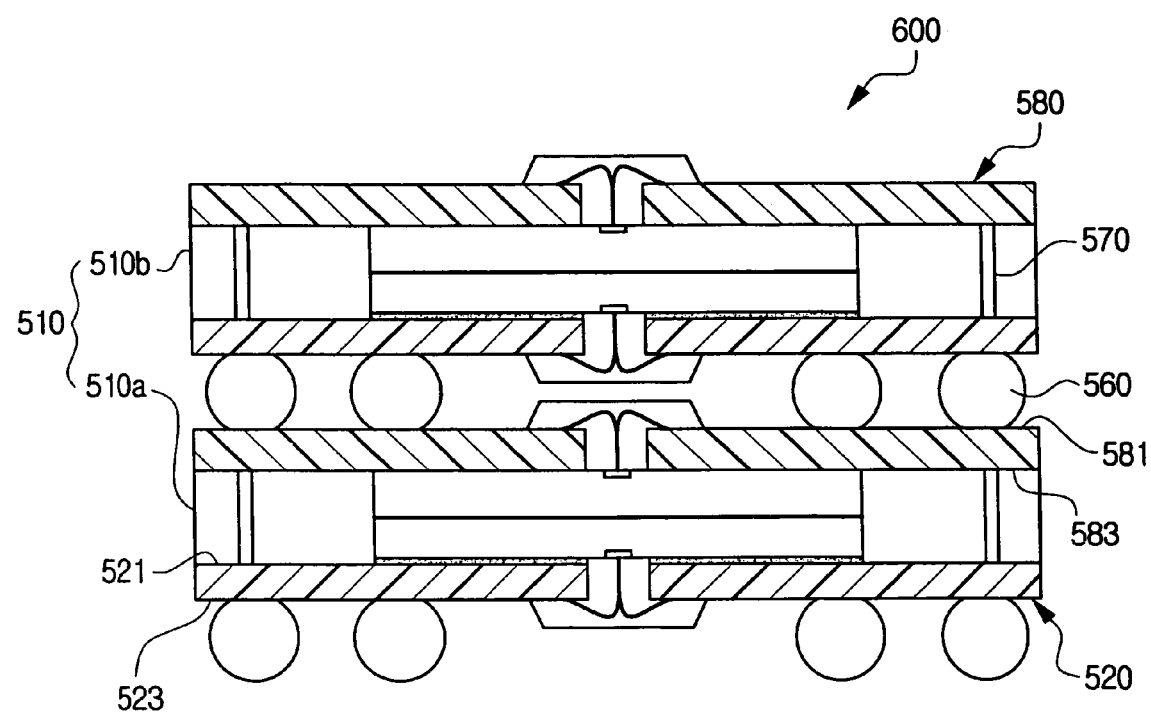
FIG. 12 is a cross-sectional view of an example stack package implementing the unit package of FIG. 11.

FIG. 11 is a cross-sectional view of a unit package 510 in accordance with another example embodiment of the present invention. FIG. 12 is a cross-sectional view of an example stack package 600 implementing the unit package 510 of FIG. 11.

Referring to FIGS. 11 and 12, the stack package 600 may have a plurality of unit packages 510 inclusive of a lower unit package 510a and an upper unit package 510b. Each unit package 510 may have a first chip 530 attached to a top surface 521 of a first substrate 520, and a second chip 533 attached to a bottom surface 583 of a second substrate 580. Conductive posts 570 may electrically connect the first substrate 520 to the second substrate 580.

The first substrate 520 may have a first window 525. The second substrate 580 may have a second window 585. The first chip 530 may have first chip pads exposed through the first window 525. The second chip 533 may have second chip pads exposed through the second window 585.

The first substrate 520 may be connected to the second substrate 580 using the conductive posts 570 such that the back of the first chip 530 may confront the back of the second chip 533. The length of the conductive posts 570 may be greater than the combined thicknesses of the first chip 530 and the second chip 533. An interposer 527 may be provided between the first chip 530 and the second chip 533 to serve as an absorber and/or an adhesive, for example.

An encapsulant 550 may seal the first window 525, the second window 585 and a gap between the first substrate 520 and the second substrate 580. The encapsulant may protect component parts of the unit package 510 from the external environment.

Conductive bumps 560 may be provided on the bottom surface 523 of the first substrate 520. The top surface 581 of the second substrate 580 may provide a conductive bump attaching area for an upper unit package on stacking the unit packages 510.

Figure 13:
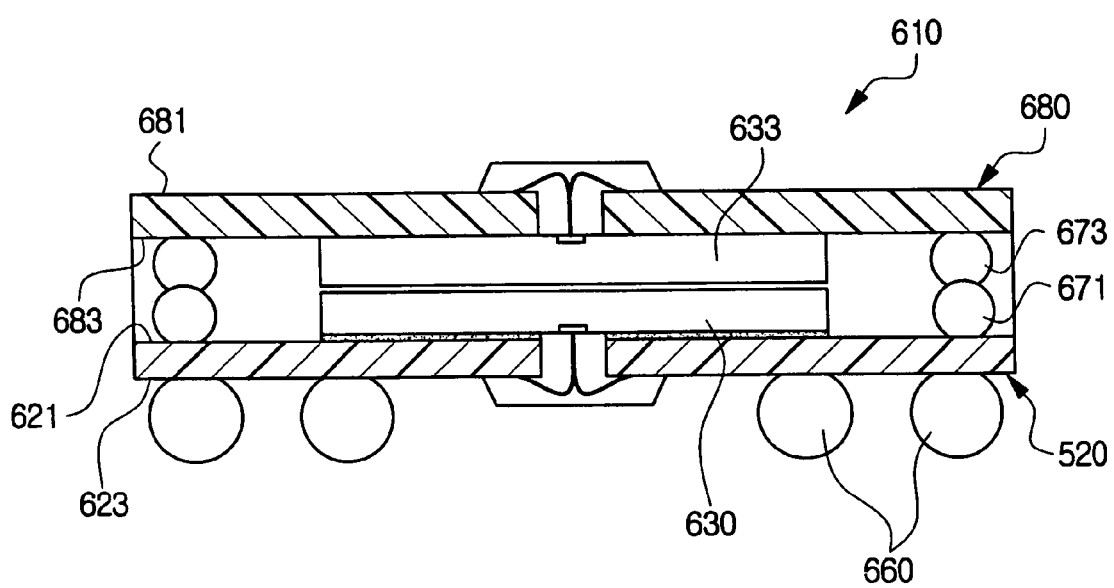
FIG. 13 is a cross-sectional view of a unit package in accordance with another example embodiment of the present invention.
Figure 14:
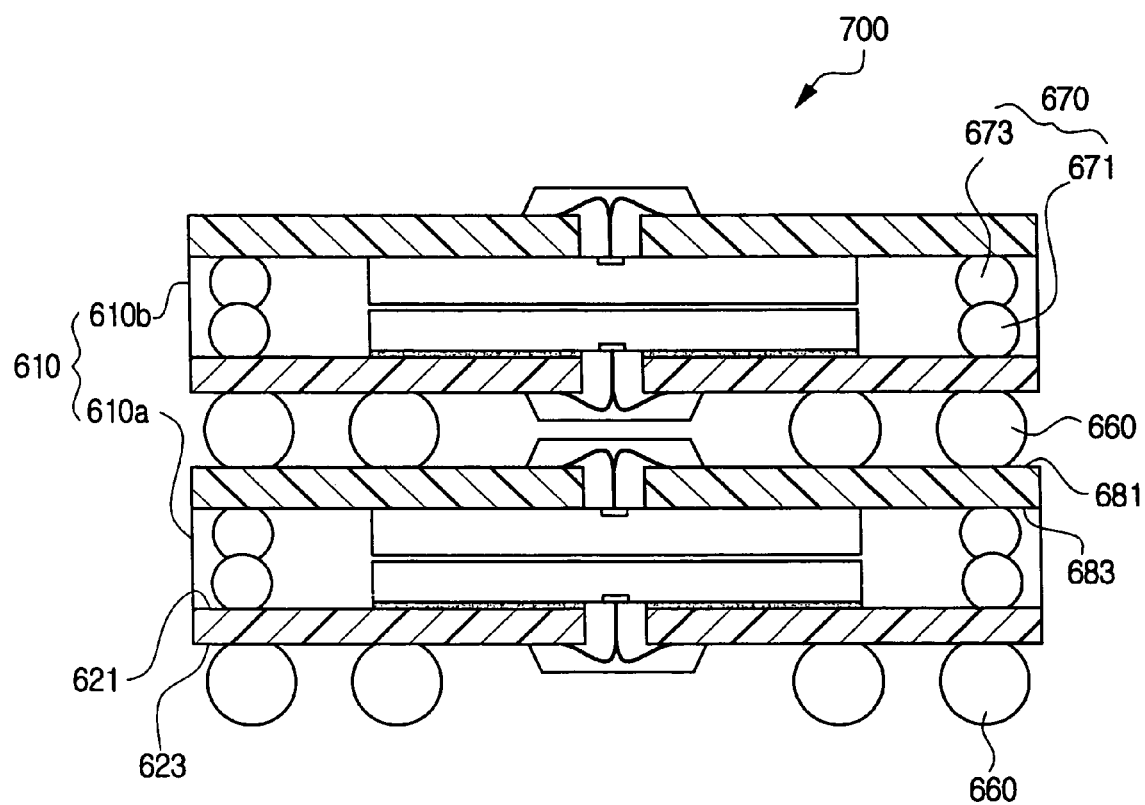
FIG. 14 is a cross-sectional view of an example stack package implementing the unit package of FIG. 13.

FIG. 13 is a cross-sectional view of a unit package 610 in accordance with another example embodiment of the present invention. FIG. 14 is a cross-sectional view of an example stack package 700 implementing the unit package 610 of FIG. 13.

Referring to FIGS. 13 and 14, the stack package 700 may have a plurality of unit packages 610 inclusive of a lower unit package 610a and an upper unit package 610b. The unit package 610 may have the same structure as the unit package 510, except for the type of conductive supports 670. Here, the conductive supports 670 may be at least one conductive bump.

By way of example only, the conductive supports 670 may include solder balls 671 and 673. The solder balls 671 and 673 may be provided on at least one of the top surface 621 of a first substrate 520 and the bottom surface 683 of a second substrate 680. For example, the solder balls 671 may be provided on the top surface 621 of the first substrate 520 and the solder balls 673 may be provided on the bottom surface 683 of the second substrate 680. Alternatively, the solder balls 671 and 673 may be provided on the top surface 621 of the first substrate 520 or the bottom surface 683 of the second substrate 680. By way of example only, the solder balls 671 and 673 may be stacked by thermocompressing the first substrate 520 and the second substrate 680.

The combined diameters of the solder balls 671 and 673 may be larger than the combined thicknesses of a first chip 630 and a second chip 633. In this example embodiment, a molding compound may be provided between the first chip 630 and the second chip 633. In alternative embodiments, an interposer may be provided between the first chip 630 and the second chip 633.

Conductive supports 670 fabricated from conductive bumps may be suitably implemented in any of the above example embodiments. In the above embodiments, a given unit package may implement conductive supports having the same shape. In alternative embodiments, a given unit package may implement conductive supports having varied shapes.

Although example, non-limiting embodiments of the present invention have been described in detail, it will be understood that many variations and/or modifications of the basic inventive concepts, which may appear to those skilled in the art, will still fall within the spirit and scope of the example embodiments of the present invention as defined in the appended claims.

What is claimed is:

1. A stack package comprising:
  a plurality of unit packages, each of the unit packages including
    a first substrate having a top surface and a bottom surface;
    a first chip mounted on the top surface of the first substrate, the first chip having an active surface and a back surface;
    a plurality of conductive supports provided on the top surface of the first substrate and electrically connected to the first chip;
    a second substrate provided on and electrically connected to the conductive supports, the second substrate having a top surface and a bottom surface;
    an encapsulant sealing the first chip and the conductive supports and exposing the top surface of the second substrate; and
    a plurality of conductive bumps provided on the bottom surface of the first substrate;
    wherein the conductive bumps of an upper unit package is connected to the second substrate of a lower unit package, and
    wherein the second substrate has a window, the width of the window is larger than the width of the first chip.

2. The stack package of claim 1, wherein the first chip is flip chip bonded to the first substrate.

3. The stack package of claim 1, wherein each of the unit packages includes bonding wires connecting the first chip to the first substrate.

4. The stack package of claim 3, wherein the bonding wires connect the active surface of the first chip to the top surface of the first substrate, and the second substrate is located higher than the bonding wires.

5. The stack package of claim 3, wherein the first chip having chip pads is attached to the first substrate having a window, the bonding wires electrically connect the chip pads exposed through the window to the bottom surface of the first substrate, and the encapsulant seals the bonding wires.

6. The stack package of claim 1, wherein the conductive supports include a post and a layer of at least one of Cu, Ni, and solder plated on the post.

7. The stack package of claim 1, wherein the conductive support includes a Cu post and a layer of at least one of Ag, In, Ni and Au plated on the Cu post.

8. The stack package of claim 1, wherein the conductive supports are fabricated from solder bumps.

9. The stack package of claim 1, wherein the conductive supports are soldered to the first substrate and the second substrate.

10. The stack package of claim 1, wherein the conductive supports are thermocompressed to the first substrate and the second substrate.

11. The stack package of claim 1, wherein the second substrate has a size corresponding to at least a solder bump attaching area of the first substrate.

12. The stack package of claim 1, wherein the second substrate covers a peripheral region of the first chip.

13. The stack package of claim 1, wherein the upper surface of the encapsulant is exposed through the window of the second substrate and ranges between the top surface and the bottom surface of the second substrate.

14. The stack package of claim 13, wherein the conductive bumps include first conductive bumps arranged corresponding to the second substrate and second conductive bumps arranged corresponding to the window of the second substrate, and the second conductive bumps of the upper unit package confront the encapsulant of the lower unit package.

15. The stack package of claim 1, wherein the second substrate covers the first chip.

16. The stack package of claim 15, further comprising a BGA unit package mounted on the second substrate of an uppermost unit package.

17. The stack package of claim 1, further comprising a second chip mounted on the bottom surface of the second substrate.

18. The stack package of claim 17, wherein the length of the conductive post is greater than the combined thicknesses of the first chip and the second chip.

19. The stack package of claim 18, further comprising an interposer provided between the first chip and the second chip.

20. A stack package comprising:
a plurality of unit packages, each of the unit packages including:
a first substrate having a top surface and a bottom surface;
a first chip mounted on the top surface of the first substrate, the first chip having an active surface and a back surface;
a plurality of conductive supports provided on the top surface of the first substrate and electrically connected to the first chip;
a second substrate provided on and electrically connected to the conductive supports, the second substrate having a top surface and a bottom surface;
an encapsulant sealing the first chip and the conductive supports and exposing the top surface of the second substrate; and
a plurality of conductive bumps provided on the bottom surface of the first substrate,
wherein the conductive bumps of an upper unit package is connected to the second substrate of a lower unit package,
wherein the second substrate has a window, the width of the window is smaller than the width of the first chip,
wherein the second substrate has an overlap portion overlapping the first chip, and
wherein the overlap portion is connected to the lower unit package.

* * * * *